(12) United States Patent
Morgan et al.

(10) Patent No.: US 9,911,484 B2
(45) Date of Patent: Mar. 6, 2018

(54) OSCILLATOR CONTROLLED RANDOM SAMPLING METHOD AND CIRCUIT

(71) Applicant: Micron Technology, Inc., Boise, ID (US)

(72) Inventors: Donald M. Morgan, Meridian, ID (US); John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/197,359

(22) Filed: Jun. 29, 2016

(65) Prior Publication Data

US 2018/0005690 A1   Jan. 4, 2018

(51) Int. Cl.
*G11C 11/00* (2006.01)
*G11C 11/406* (2006.01)
*G11C 11/408* (2006.01)

(52) U.S. Cl.
CPC ...... *G11C 11/40615* (2013.01); *G11C 11/408* (2013.01); *G11C 11/40618* (2013.01)

(58) Field of Classification Search
CPC ......... G11C 11/40611; G11C 11/40618; G11C 11/406; G11C 11/40622; G11C 11/408; G11C 7/1072; G11C 11/40603; G11C 11/4076
See application file for complete search history.

(56) References Cited

U.S. PATENT DOCUMENTS

| 9,478,316 | B1 * | 10/2016 | Ryu | G11C 29/785 |
| 9,646,672 | B1 * | 5/2017 | Kim | G11C 11/406 |
| 2014/0006703 | A1 * | 1/2014 | Bains | G11C 11/40618 711/106 |
| 2014/0281206 | A1 * | 9/2014 | Crawford | G11C 11/406 711/106 |
| 2015/0213872 | A1 * | 7/2015 | Mazumder | G11C 11/408 365/218 |
| 2016/0027532 | A1 * | 1/2016 | Kim | G11C 29/83 365/200 |
| 2016/0086649 | A1 * | 3/2016 | Hong | G11C 11/406 365/96 |

\* cited by examiner

*Primary Examiner* — Hien Nguyen
(74) *Attorney, Agent, or Firm* — Schwegman Lundberg & Woessner, P.A.

(57) ABSTRACT

Various embodiments comprise methods and apparatuses for selecting a randomly-chosen seed row from among a stream of available data in a memory system. A refresh operation is then performed on at least one selected row of memory in the memory system based on the randomly-chosen seed row. Additional apparatuses and methods are described.

15 Claims, 7 Drawing Sheets

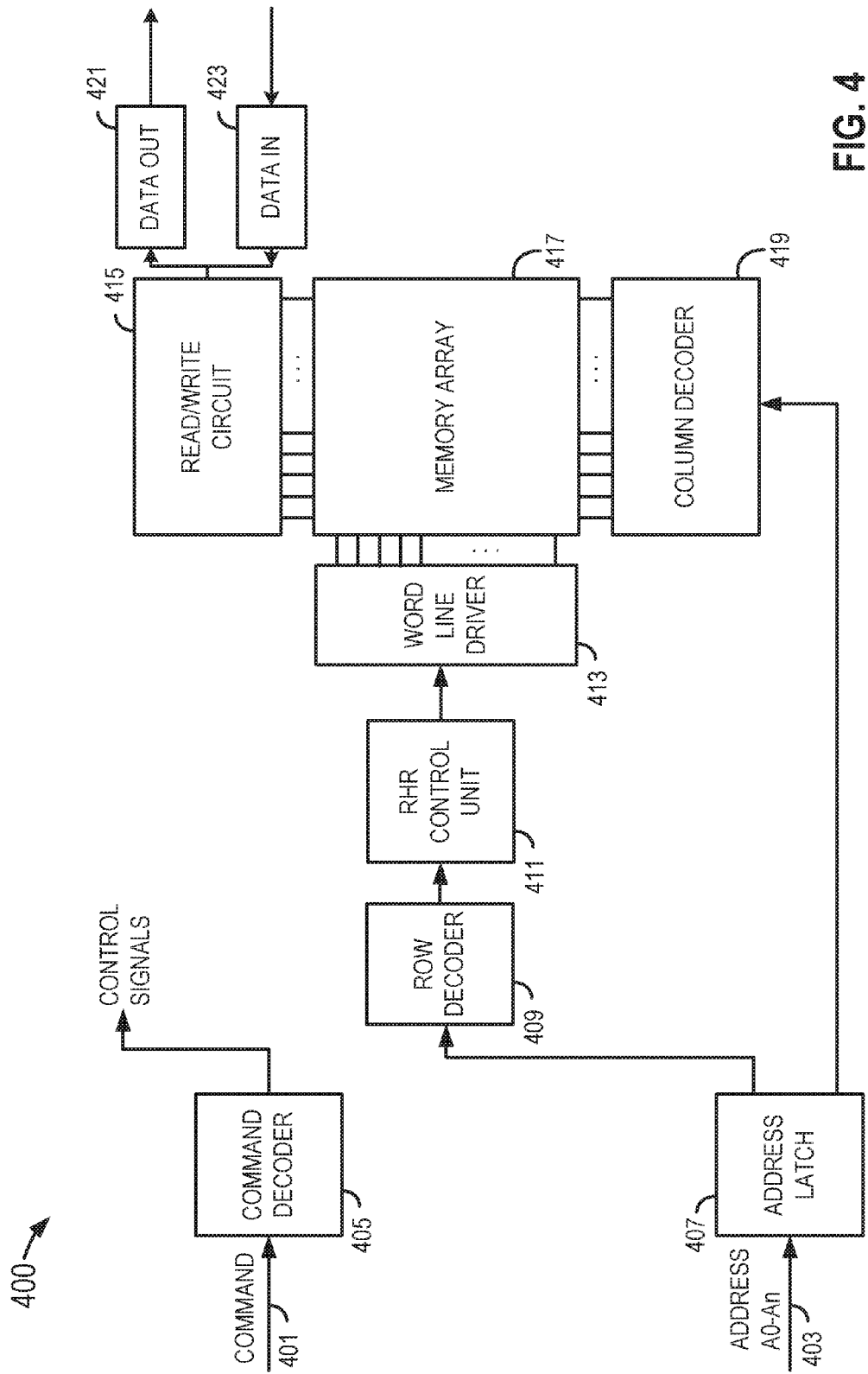

US 9,911,484 B2

OSCILLATOR CONTROLLED RANDOM SAMPLING METHOD AND CIRCUIT

TECHNICAL FIELD

Embodiments of the present invention relate generally to semiconductor memory, and more specifically, in one or more disclosed embodiments, to refreshing a row or rows of memory physically adjacent to a randomly-selected row of memory.

BACKGROUND

In current memory systems, data stored in volatile memories (e.g., in dynamic random access memory, DRAM) must be refreshed periodically to compensate for inherent leakage of capacitors in each of the memory cells. Refreshing includes, for example, reading data out of each row of memory and subsequently writing the data back to the same respective row. As a result, the original charge level on each capacitor is restored and data are preserved.

However, data stored in rows of memory physically adjacent a repeatedly accessed row may be disturbed and may degrade more quickly than data stored in other rows. That is, due to coupling effects between adjacent rows, cell-to-cell leakage may increase, and accessing a row a relatively high number of times (e.g., hundreds of thousands) during a particular period of time (e.g., less than 32 msec) may degrade data stored in rows physically adjacent or otherwise proximate to the accessed row. This phenomenon is referred to as "row hammering."

Presently, there are various types of techniques and systems used for row-hammer repair (RHR) in order to refresh memory lines adjacent a hammered row. However, these approaches have struggled when applied to the increasingly demanding operating speeds and applications of contemporaneous memories. For example, in one technique, the number of times every row within a memory array (or banks of memory arrays) is accessed is tracked and recorded. Rows adjacent the accessed rows are then sent a refresh signal. However, maintaining counts in this manner is cumbersome and requires a relatively large footprint for the associated circuitry. In other techniques, sampling of activated rows is employed. However, the sampled activation row is always tied to the refresh interval. As a result, the probability of a missed activations is greater than desired and, consequently, a proper RHR cannot be accomplished.

BRIEF DESCRIPTION OF THE DRAWINGS

FIG. 4 is a block diagram of an exemplary memory device having a memory array incorporating embodiments of the row-hammer repair device, according to various embodiments.

DETAILED DESCRIPTION

Figure 1A:
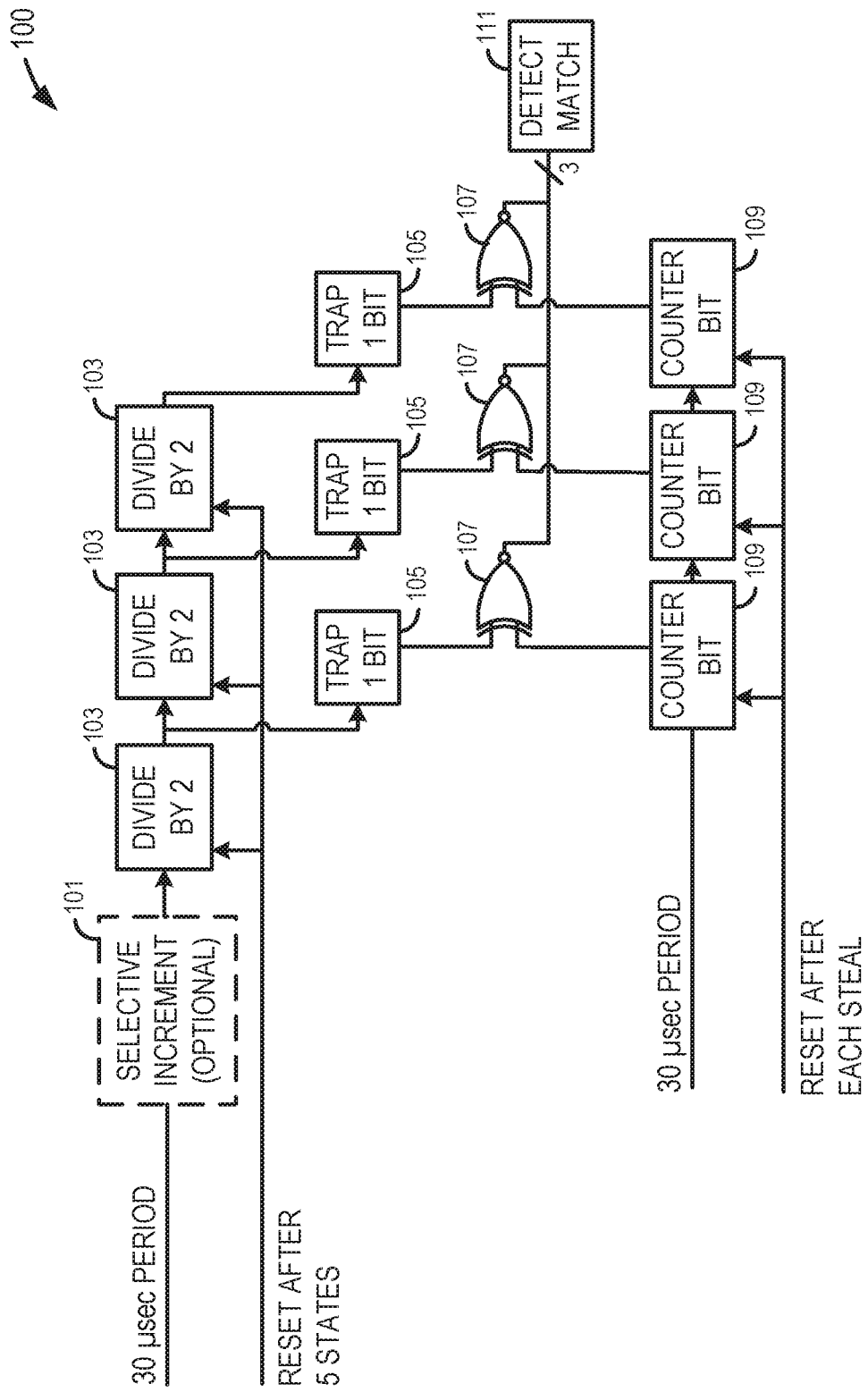
FIG. 1A is an exemplary schematic diagram of an oscillator-controlled random sampling device, according to an embodiment.

The description that follows includes illustrative apparatuses (circuitry, devices, structures, systems, and the like) and methods (e.g., processes, protocols, sequences, techniques, and technologies) that embody the disclosed subject matter. (The disclosed subject matter will simply be referred to as "the invention" hereinafter for brevity of notation. However, the actual scope of the invention is not limited to the embodiments disclosed herein. Instead the invention is only limited by a scope of the appended claims.) In the following description, for purposes of explanation, numerous specific details are set forth in order to provide an understanding of various embodiments of the inventive subject matter. After reading this disclosure, it will be evident to those of ordinary skill in the art however, that various embodiments of the subject matter may be practiced without these specific details. Further, well-known apparatuses and methods have not been shown in detail so as not to obscure the description of various embodiments. Therefore, certain details are set forth below to provide a sufficient understanding of various embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

In one embodiment, a method and related circuit to select a sample from among a stream of available data where all data has an approximately equal chance of being chosen is disclosed. An oscillator with no synchronous relationship to the timing of the data stream is used to randomize selection of the sample. Therefore, apparatuses and methods for randomly-selected selective row refreshes are disclosed herein. In accordance with one or more embodiments of the described invention, one or more rows physically adjacent a randomly-selected row may be refreshed.

One method to provide extra refresh (referred to as row hammer repair or RHR) is to allocate a predetermined fraction of refresh cycles to RHR and to use a refresh address calculated from a randomly-chosen seed row for each of those RHR refresh cycles. In order for this method to be statistically valid, any access cycle should be equally likely to have its address used as the seed row for an upcoming RHR. The methods and circuits disclosed use an oscillator with no synchronous relationship to the periodic access cycles to trigger an address sample and provide a seed address for the next RHR. Further, this method samples the next access address after an RHR and then overwrites this sample at the next access after a toggle of the asynchronous oscillator mentioned above. This process continues to overwrite the old sample based on the oscillator state changing a random number of times, then stops. The acquired address is then held for use as the seed of the next RHR.

As is also contemplated by the various embodiments, as feature sizes continue to shrink, rows of memory in a DRAM array become increasingly close together to the point that multiple accesses to any certain row can cause disturbance to bits on adjacent rows that are proximal to the certain row, beyond simply the nearest-neighbor row or rows. The proximal rows, as well as the nearest-neighbor rows, will then need more frequent refreshes than provided by normal scheduling.

Typically, memories, such as DRAM, operate in accordance with at least three types of operations: read operations, write operations, and refresh operations. For each operation, an active command is provided to activate (e.g., open) a particular row.

Read and write operations may be performed using an externally generated address (e.g., external address), which may be decoded into a target address. For example, the external address and an activate command may be provided to a memory, and in response, a target row associated with the target address may be activated. When a subsequent read or write command is provided to the memory, the memory may read data from or write data to the target row accordingly.

Refresh operations may be performed using an internally generated address (e.g., refresh address). For example, a refresh command may be provided to a memory and cause a row associated with a refresh address to be refreshed. Refresh operations may, for instance, be interleaved with other operations (e.g., read operations and write operations), allowing a memory to refresh rows as necessary.

In at least one embodiment, a proximate address may comprise an address associated with a row physically adjacent a target row, for example, a row associated with a target address. As discussed, if a target row is repeatedly accessed (e.g., in association with a read operation or a write operation), coupling effects between rows may result in increased cell-to-cell leakage and degradation of data stored in rows physically adjacent a repetitively accessed row. Accordingly, by refreshing rows associated with proximate addresses in association with refresh operations, the physically adjacent rows may be refreshed more frequently, thereby reducing degradation of the data stored by the adjacent rows. By latching the most recent randomly-selected address, and subsequently refreshing the rows physically adjacent the target row associated with the randomly-selected address, the physically adjacent rows may be refreshed without a need to determine a number of times a row is accessed within a particular period of time.

Therefore, embodiments of the circuit and technique described herein may be selected such that each row activation has an equal probability of providing a seed address for a subsequent row hammer repair (RHR) refresh. There is no relationship between a reference oscillator output signal and a control signal being sent to a memory array. The system clock associated with the memory array is completely independent of the oscillator signal used to determine a random row of memory. Therefore, the address of every access to the memory has almost an equal probability of being used as the seed of an RHR. The sample is not tied to the refresh interval. The disclosed method and associated apparatuses were developed to obtain the address of a random one of many rows accessed by a DRAM memory in order to insure statistically that any row accessed greater than a certain threshold number of times will have its address chosen. To determine the threshold, a sample number of devices are characterized for row-hammer fail. The threshold number is chosen to provide margin to fail. As design rules decrease, there will be a requirement for an increasing amount of RHR.

In other embodiments, the apparatuses and accompanying methods may be selected such that row activations occurring within certain time intervals have an increased likelihood of being selected, thereby lowering the possibility of row activations from other time intervals being selected. Any or all of these embodiments may be considered independently or may be implemented jointly. Further, each of the embodiments is discussed in greater detail herein.

With reference now to FIG. 1A, an exemplary schematic diagram of an oscillator-controlled random sampling device 100 is shown. In various embodiments, the oscillator-controlled random sampling device 100 may include an optional selective-increment circuit 101, a plurality of divide-by-two circuits 103, a plurality of trap circuits 105, a plurality of comparators 107 (shown in this embodiment to be implemented as a plurality of logic gates), a plurality of counters 109, and a detect match circuit 111.

In various embodiments, the oscillator-controlled random sampling device 100 may be instantiated for each bank within a memory circuit. In various embodiments, row activations may be sampled per bank of memory. The row activation randomly-sampled for a given bank may then be used for the RHR. Therefore, in one embodiment, each bank may be sampled independently and/or at random times from other banks. In other embodiments, the random sampling disclosed herein for a single bank may be used to supply RHR refresh signals to one or more multiple banks. Therefore, only one circuit may be used globally to cover all banks of memory.

The optional selective-increment circuit 101 may be implemented if, for example, a circuit designer chooses to select a particular point within a given window. For example, the designer may choose to start an RH repair 60 μsec into a 128 μsec timing window. Consequently, the optional selective-increment circuit 101 may be considered in particular circuit designs to provide a particular starting point in a given time interval for a selected window.

Overall, if there is ever even one activate in a bank between RHR events, that address is captured. Therefore the first activate is always sampled and the address is recorded. Consequently, there is no randomness in capturing the first activate signal. However, another activate is then randomly selected within, for example, a 30 μsec interval and the first address is then overwritten. The 30 μsec interval is based on a specific exemplary embodiment and is discussed in more detail below. However, based on reading and understanding the disclosure provided herein, a person of ordinary skill in the art will recognize that other intervals may be used.

In this embodiment, the oscillator-controlled random sampling device 100 provides 30 μsec edges to a first of the plurality of divide-by-two circuits 103 to provide a random number which is latched at each RHR event. The random number of samples is determined by capturing the count of oscillator state changes and comparing that count with the number of samples taken. In various embodiments, an oscillator output signal may be divided to obtain a suitable frequency of sampling. A first row-activation event after an RHR provides the initial seed address. Additionally, each subsequent 30 μsec edge increments a second of the plurality of counters 109 thereby causing the next activate address to be sampled. Since the oscillator is asynchronous, the next sample could occur on the second activation or at any time up to 30 μsec later. At the time of or immediately after the RHR event, the content of each of the plurality of one bit divide-by-two circuits 103, is trapped by the trap circuit 105 for comparison with a respective counter 109 by a respective one of the plurality of comparators 107. The counters 109 are reset after each "steal" of a refresh event or RHR (e.g., after 16 refresh cycles as described below). Also, one bit is trapped by the trap circuit 105 after each "steal." Additionally, for this embodiment in which five 30 µsec intervals are selected, each of the divide-by-two circuits 103 is reset after five states. This process repeats until the second counter matches the latched count from the first counter as detected by the detect match circuit 111. After a match is detected, no more addresses will be sampled so that the next RHR will use the last address sampled as a seed for the next cycle. As will be evident to a person of ordinary skill in the art, three bits are used in this embodiment to represent a binary five (101) in relation to the five 30 µsec intervals, therefore there are three placements of each component 103, 105, 107, 109.

Sampling is stopped at a random time as determined by the cross of the 30 µsec interval count tracked by counters 109 and the random activate count captured by the plurality of trap devices 105 when the RHR interval began.

In a specific exemplary embodiment, a number of possible 30 µsec intervals used may be selected to be larger than the average RHR interval. However, the randomness of the sampling increases if the number of possible 30 µsec intervals used is not much larger than the RHR interval. Reasons for this selection of the number of possible intervals is described in more detail with regard to FIGS. 1B and 3D, below.

The skilled artisan will recognize that, depending on the number of samples chose, the output frequency of the reference oscillator, the interval between RHR events, and other factors, various components shown in the oscillator-controlled random sampling device 100 may be substituted, combined, or eliminated. Therefore, the oscillator-controlled random sampling device 100 is provided merely as an example to show one possible way of implementing the concepts and techniques described herein. Further, other types of reference oscillator may be employed. However, having an oscillator with a relatively low frequency output signal is conducive to a reduced current usage.

Based on the embodiments disclosed herein, there is a completely asynchronous relationship between the oscillator and the memory row activations. As a result, the asynchronous relationship helps makes the sample time desirably random and unpredictable. Additionally, the oscillator-controlled random sampling device 100 may be divided to provide a given periodic edge that provides for a given number of periods occurring that are slightly longer than an average selected RHR interval.

Figure 1B:
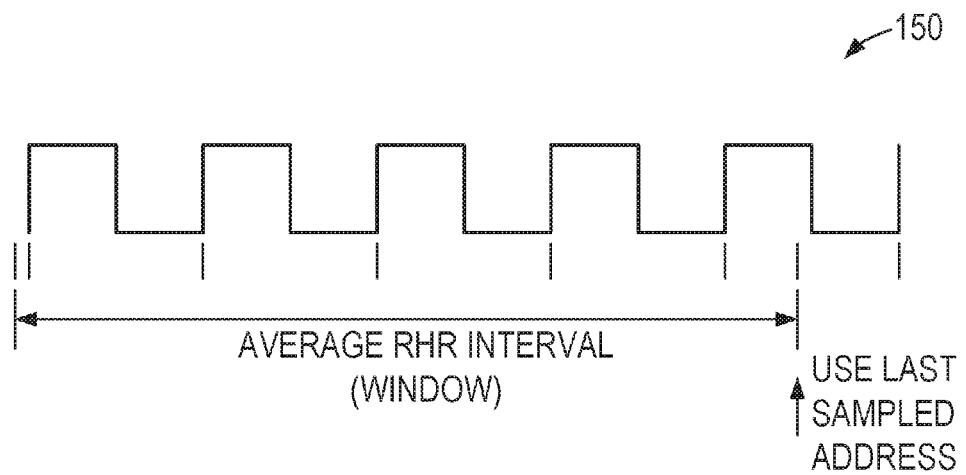
FIG. 1B is a graphical comparison of a specific exemplary embodiment of five sample windows compared with an average RHR interval.

Referring now to FIG. 1B, a graphical comparison 150 of a specific exemplary embodiment of five sample windows is compared with an average RHR interval. In various embodiments of the sampling algorithm disclosed herein, and as discussed above, multiple sampling edges in each sample cycle are chosen to be longer than the average time between RHR refresh events. For example, if a refresh is used (referred to "stealing" a refresh) after every 16 standard refreshes, and the refresh interval is 7.8 µsec for a given memory design, then the average RHR interval, based on the $17^{th}$ refresh, is 7.8 µsec×17 or approximately 133 µsec. For example, with an oscillator having a period of 450 nsec, with the memory system described immediately above designed to have an average RHR interval of 133 µsec, a periodic output of the reference oscillator signal, $S_{ref}$, can be chosen at every $64^{th}$ edge (i.e., the oscillator output frequency divided by 64), yielding 450 nsec×64=28.8 µsec (so approximately 30 µsec periods). With the implementation of five time intervals that are approximately 30 µsec each, the sample may be over-written up to five times as needed.

A multiple of sampling edges is then chosen to be slightly longer than the average RHR refresh interval. In this example, five of the 28.8 µsec time periods are chosen to be slightly longer than the 133 µsec refresh window (5×28.8 µsec=144 µsec). Therefore, there is an 11 µsec difference between the 144 µsec total sample window and the 133 µsec average RHR refresh window. The 11 µsec difference is a time in which the probability of sampling approximately doubles over other time periods within the 144 µsec window. This phenomenon is discussed in more detail, below, with reference to FIG. 3D.

Based on embodiments described herein, the confidence interval of catching a particular row when it is hammered is approximately 4-9's as a worst-case scenario based on the examples given. However, much higher confidence intervals may be realized by stealing more refreshes than would have been used in the examples provided herein. Depending upon a selected probability (determined from well-known statistical calculations) of capturing a row activation causing a hammering event, the person of ordinary skill in the art will also then understand how to select and apply a different sampling interval for a given memory design. Regardless, the interval chosen (e.g., the 30 µsec interval) is completely asynchronous to the RHR interval, as is discussed below in more detail.

Figure 2:
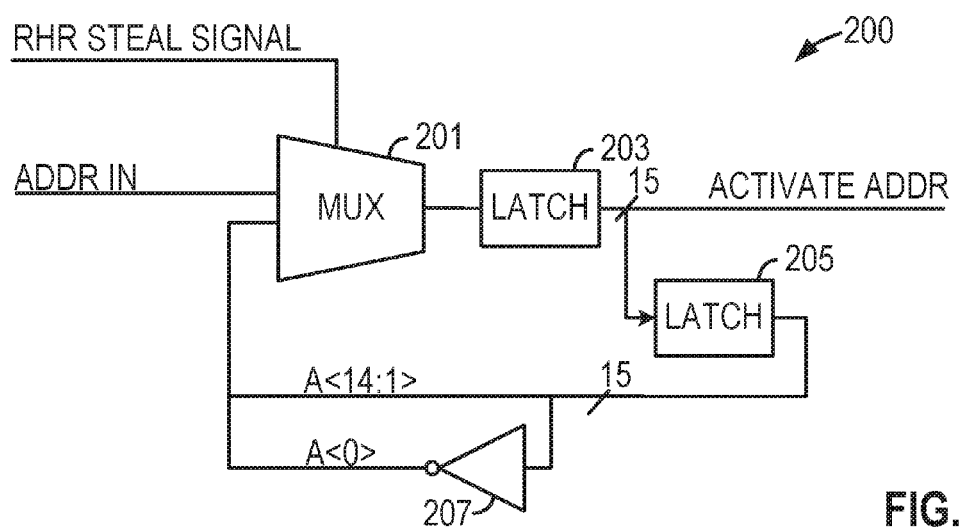
FIG. 2 is an embodiment of a row-hammer repair (RHR) selector circuit.

Referring now to FIG. 2, a row-hammer repair (RHR) address selector circuit 200 is shown to include a multiplexer 201, a first latch 203, a second latch 205, and an inverter 207. The RHR address selector circuit 200 is designed to determine and select either a row prior (e.g., decrement an address) or a row subsequent to (e.g., increment an address. Consequently, a neighboring row immediately before or after a given seed row is determined and addressed. An RHR steal signal is provided to the multiplexer 201 of the RHR address selector circuit 200 to select between the ADDR IN and a previously-latched address. The inverter 207 inverts the A<0> signal to process the seed address and provide the address of either the prior or subsequent row to the seed row as explained above. More complex address processing may be used to determine the addresses of other rows proximate to the seed row as may be employed by some systems.

In this example, there are $2^{15}$ possible rows to be activated. Based on the RHR steal signal, the multiplexer 201 selects between an RHR based on the randomly-sampled row selected by the oscillator-controlled random sampling device 100 of FIG. 1A, or the ADDR. The ADDR IN input is used as the activate address for normal operations and the modified seed row address is used for RHR operations.

Moreover, a person of ordinary skill in the art will recognize, based on reading and understanding the disclosure provided herein, that as design rules of semiconductor devices continue to grow smaller, there will be a concomitant decrease in the spacing between adjacent rows in a memory device. Consequently, as the rows become closer to each other, RH effects may affect rows beyond just the nearest neighboring rows. For example, in addition to +1 row beyond an addressed row, more distal rows (e.g., ±1 rows, +2 rows, etc.) may be impacted by row hammering. Therefore, the skilled artisan will understand how to modify the RHR address selector circuit 200 of FIG. 2 to include RHR functionality for these more distal rows.

Figure 3A:
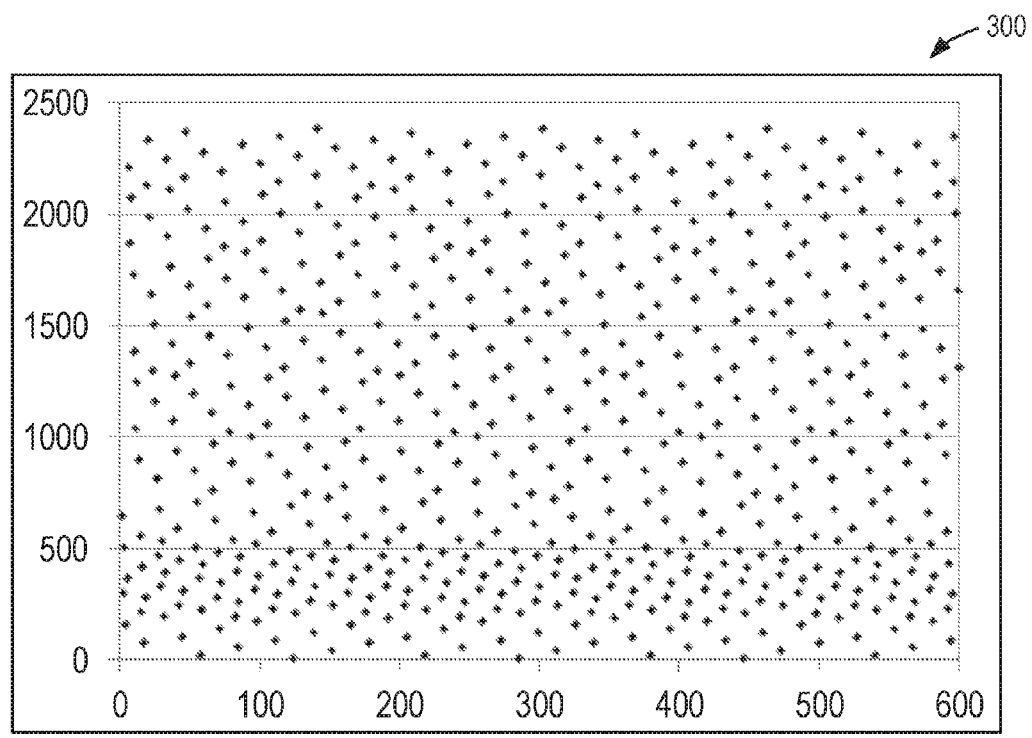
FIGS. 3A-3C show graphs of short-loop simulation data calculated in order to determine an original proof-of-concept according to various embodiments.
Figure 3B:
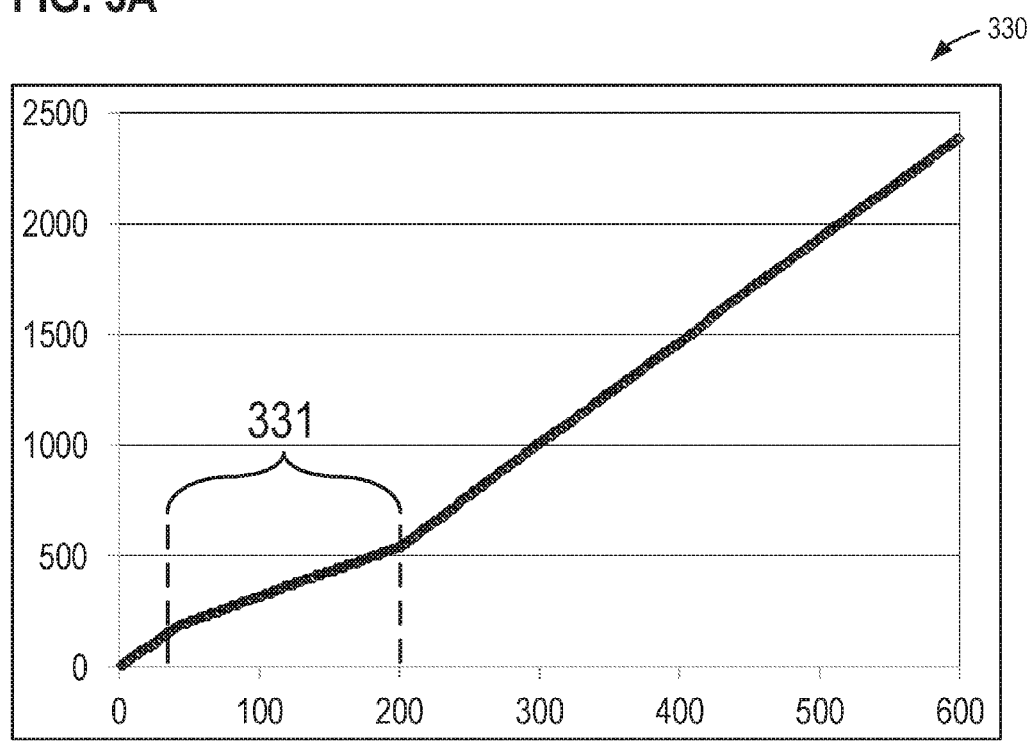
Figure 3C:
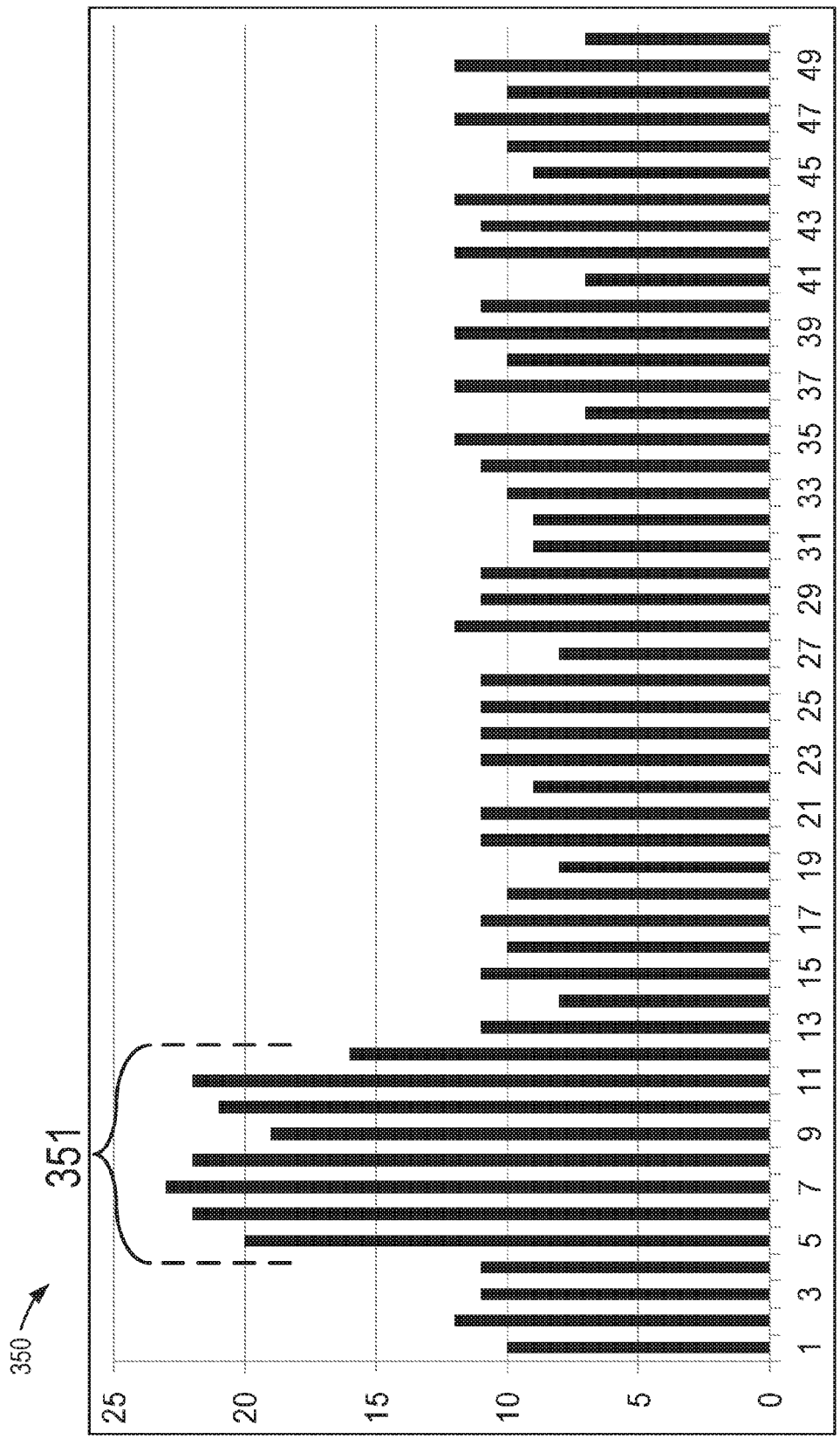

FIGS. 3A-3C show graphs of short-loop simulation data calculated in order to determine an original proof-of-concept, including determining a level of randomness of the selected samples and determining whether any samples were missed within a given sampling window. Even though there are millions of RHR events occurring in a limited timeframe in actual memory operations, the simulation data were developed to determine an overall efficacy of the system disclosed herein. Each of the graphs is therefore based on a limited number of simulated sample points to gauge the actual randomness of the selected sample points. These graphs demonstrate the distribution of addresses sampled between RHR events. For example, a first graph 300 (FIG. 3A) shows 600 RHR events as raw data in its original order where a given window size (e.g., 0 to 2400 time units) is plotted as a function of the number of RHR events.

In FIG. 3B, the graph 330 shows the same 600 original events where the raw data are sorted. The change in the slope of the line at 331 is indicative of double sampling of the activations. In FIG. 3C, the graph 350 shows a time window (2400 units) that is divided into 50 equal groups of 12, and then grouped by the number of RHR events occur within each group. Similar to graph 330, graph 350 of FIG. 3C indicates the same double-sampling phenomenon occurring at group range 351.

Figure 3D:
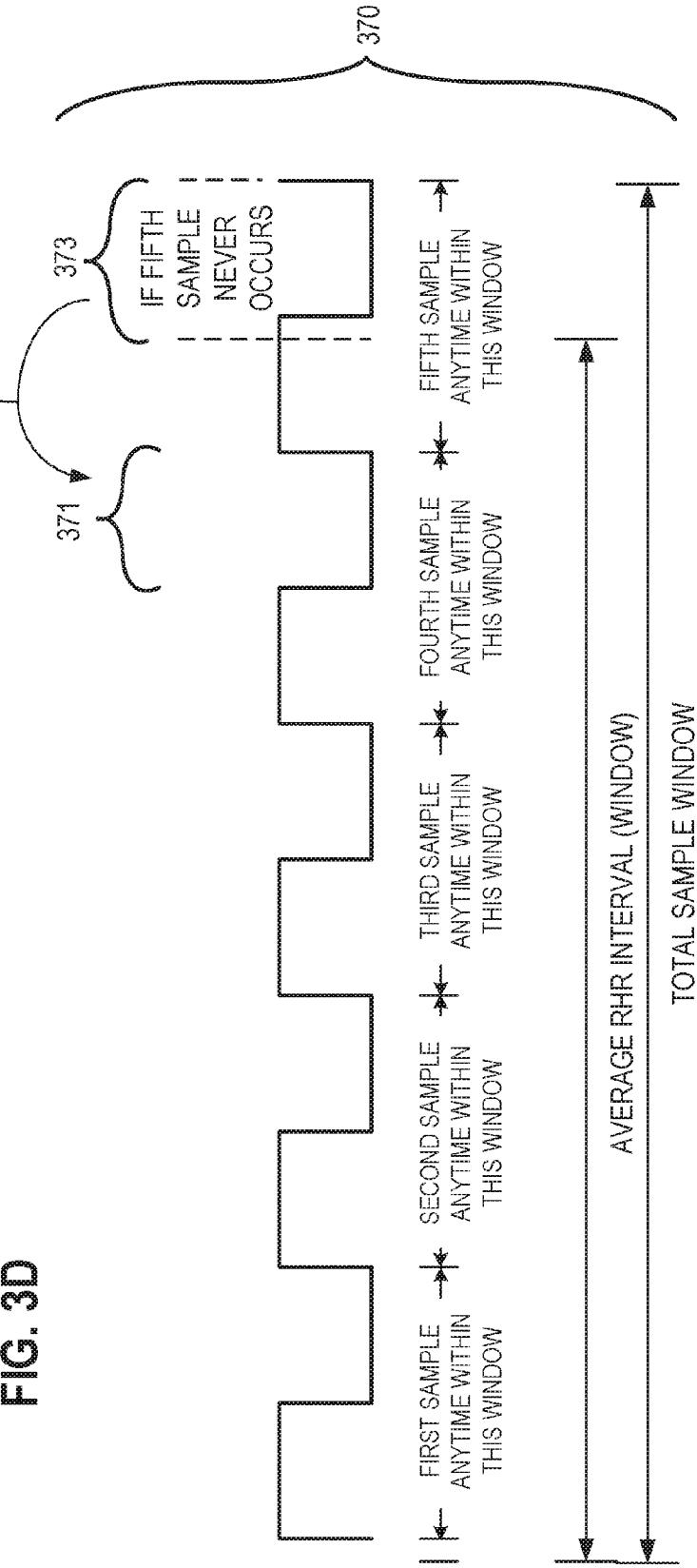
FIG. 3D shows a combined average RHR interval and total sample window graph.

FIG. 3D provides an explanation of the double-sampling phenomenon exhibited by FIGS. 3B and 3C (which is also detectable in FIG. 3A as a higher concentration of events in a given time window). There are at least two randomizing factors in the method disclosed herein. First, the recurring sample timing is asynchronous and unpredictable. Second, an overwrite of the last sample will cease after a random number of samples. Assuming that the circuit is equally likely to stop sampling after the first, second, third, and so forth samples, a skilled artisan should would expect a very even distribution of sampling.

However, recall that, to increase the randomness of the samples, the number of samples is designed to be slightly larger than the repair window. That means that the last sampled time division will not always be complete. Therefore, when the sample is destined to be past the time within the window, that sample will not occur. The result is that the next-to-last sample will be partially doubled. The next-to-last sample will be kept both when it is randomly selected and when the last sample never occurs due to the last division being past the repair window.

With continuing reference to FIG. 3D, since the five 30 µsec periods are not an integral multiple of the average RHR interval, the double sampling may occur. However, if the time periods were chosen to be an integral multiple of the average RHR interval window, then the selected samples would be less random. As noted above, the average RHR interval window (e.g., 7.8 µsec×17=133 µsec) and the total sample window (e.g., 28.8 µsec×5=144 µsec) were specifically chosen such that the total sample window is slightly longer than the average RHR interval window. As also discussed above, in various embodiments, the probability of selecting a sample may be distributed evenly over a given RHR interval. In various embodiments, a sample is randomly selected and is thus not tied to the RHR interval.

For example, within the combined average RHR interval and total sample window graph 370, if a fifth sample never occurs at time period 373 (based on the match detected earlier in the oscillator-controlled random sampling device 100 of FIG. 1A), then the fourth sample is used. As a result of the fourth sample being used, there is an increased probability that an address is selected during the latter part of the fourth sample time period, as designated by the time period 371. Of course, based on the examples provided herein, the skilled artisan will recognize that fewer double-sampling events may occur depending on the relationships selected between, for example, the number of sampling windows and the average RHR interval.

Referring now to FIG. 4, an exemplary block diagram of an apparatus in the form of a memory device 400 incorporating various embodiments of an RHR control unit 411 is shown. The RHR control unit 411 may comprise circuits similar or identical to the oscillator-controlled random sampling device 100 of FIG. 1A and the row-hammer repair (RHR) selector circuit of FIG. 2. The memory device 400 includes a memory array 417, comprising memory cells, which may be, for example, volatile memory cells, non-volatile memory cells, DRAM memory cells, SRAM memory cells, flash memory cells, or other types of memory cells. The memory device 400 is shown to include a command decoder 405 that receives memory commands and addresses through an ADDR/CMD bus 401. The command decoder 405 provides control signals to the remainder of the memory device 400, based on the commands received through the ADDR/CMD bus 401. The command decoder 405 also provides row and column addresses to the memory device 400 through an address bus 403 and an address latch 407. The address latch then outputs separate column addresses and separate row addresses.

The row and column addresses are provided by the address latch 407 to a row decoder 409 and a column decoder 419, respectively. The row decoder selects selected row addresses of the memory array 417, as described above. The column decoder 419 selects bit lines extending through the memory array 417 corresponding to respective column addresses. The row decoder 409 is coupled to the RHR control unit 411, which, as noted, may comprise various embodiments of the oscillator-controlled random sampling device 100 of FIG. 1A and the row-hammer repair (RHR) selector circuit of FIG. 2, as described above. A skilled artisan will recognize that a multiplexer (not shown) may also be used to select between a target address and a refresh address (or addresses). The RHR control unit 411 may be coupled to a word line driver 413 that activates respective rows of memory cells in the memory array 417 corresponding to received ones of the row addresses. The selected data line (e.g., a bit line or bit lines) corresponding to a received column address is coupled to a read/write circuit 415 to provide read data to a data output circuit 421 via an input-output data bus. Write data are provided to the memory array 417 through a data input circuit 423 and the memory array read/write circuit 415. The command decoder 405 responds to memory commands and addresses provided to the command bus to perform various operations on the memory array 417. In particular, the command decoder 405 is used to provide control signals to read data from and write data to the memory array 417.

Although the RHR control unit 411 is shown located between the row decoder 409 and the word line driver 413, a skilled artisan, upon reading and understanding the disclosure provided herein, will recognize that the RHR control unit 411 may be located in other parts of the memory device 400. For example, in one embodiment, the RHR control unit 411 may be located as a portion of the command decoder 405 or upstream of the address latch 407. In other embodiments, the RHR control unit 411 may be located within an external controller device, as described below with reference to FIG. 5.

One of ordinary skill in the art may also recognize that the memory device 400 may include other components, at least some of which are discussed herein. However, several of these components are not shown in the figure, so as not to obscure details of the various embodiments described. The memory device 400 may include devices and memory cells, and operate using memory operations (e.g., programming and erase operations) similar to or identical to those described herein with reference to various other figures and embodiments discussed.

Based on reading and understanding the disclosure provided herein, a person of ordinary skill in the art may readily extend the techniques and concepts to any number of banks of memory, operating speeds, various arrangements of memory cells, and so on. Thus, many embodiments may be realized.

Figure 5:
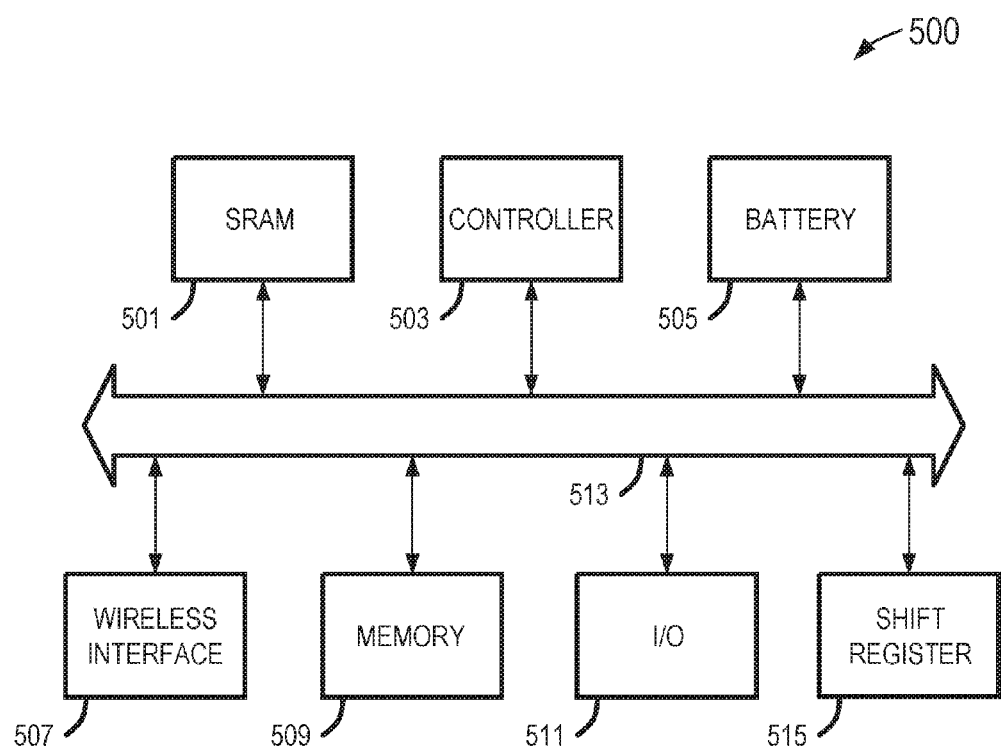
FIG. 5 is a block diagram of a system embodiment, including a memory device.

For example, a system 500 of FIG. 5 is shown to include a static random access memory (SRAM) device 501, a controller 503, an input/output (I/O) device 511 (e.g., a keypad, a touchscreen, or a display), a memory device 509, a wireless interface 507, and a shift register 515 coupled to each other via a bus 513. A battery 505 may supply power to the system 500 in one embodiment. The memory device 509 may include a DRAM memory, a NAND memory, a flash memory, a NOR memory, a combination of these, or the like.

The controller 503 may include, for example, one or more microprocessors, digital signal processors, micro-controllers, or the like. The memory device 509 may be used to store information transmitted to or by the system 500. The memory device 509 may optionally also be used to store information in the form of instructions that are executed by the controller 503 during operation of the system 500 and may be used to store information in the form of user data either generated, collected, or received by the system 500 (e.g., such as image data). The instructions may be stored as digital information and user data may be stored in one section of the memory as digital information and in another section as digitally-encoded analog information. As another example, a given section at one time may be labeled to store digital information and then later may be reallocated and reconfigured to store analog information. In an embodiment, the controller 503 or the memory device 509 may include one or more of the RHR refresh devices described herein.

The I/O device 511 may be used to generate information. The system 500 may use the wireless interface 507 to transmit and receive information to and from a wireless communication network with a radio-frequency (RF) signal. Examples of the wireless interface 507 may include an antenna, or a wireless transceiver, such as a dipole antenna. However, the scope of the inventive subject matter is not limited in this respect. Also, the I/O device 511 may deliver a signal reflecting what is stored as either a digital output (if digital information was stored), or as an analog output (if analog information was stored). While an example of a wireless application is provided above, embodiments of the inventive subject matter disclosed herein may also be used in non-wireless applications as well.

The various illustrations of the methods and apparatuses are intended to provide a general understanding of the structure of various embodiments and are not intended to provide a complete description of all the elements and features of the apparatuses and methods that might make use of the structures, features, and materials described herein.

For example, although examples described herein are directed to selective row disturbs and refreshes, the person of ordinary skill in the art will appreciate that the described examples may be applied to memory cells such that selective column disturbs may be mitigated as well. In this manner, embodiments described herein may be applied to repair a plurality of memory cells configured in any arrangement, such as in a row, column, fat row (e.g., multiple rows), fat column (e.g., multiple columns), or combination thereof.

Therefore, the various illustrations of the methods and apparatuses are intended to provide a general understanding of the structure of various embodiments and are not intended to provide a complete description of all the elements and features of the apparatuses and methods that might make use of the structures, features, and materials described herein.

The apparatuses of the various embodiments may include or be included in, for example, electronic circuitry used in high-speed computers, communication and signal processing circuitry, single or multi-processor modules, single or multiple embedded processors, multi-core processors, data switches, and application-specific modules including multilayer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

A person of ordinary skill in the art will appreciate that, for this and other methods disclosed herein, the activities forming part of various methods may be implemented in a differing order, as well as repeated, executed simultaneously, with various elements substituted one for another. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as exemplary illustrations of various aspects. Many modifications and variations can be made, as will be apparent to a person of ordinary skill in the art upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. Further, as used herein, the term "or" may be construed in an inclusive or exclusive sense. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method, comprising:
   selecting a randomly-chosen seed row from among a stream of available data in a system;
   performing a refresh operation to at least one selected row of memory in the memory system based on the randomly-chosen seed row;
   selecting an oscillator having no synchronous relationship to periodic access cycles within a memory system; and
   triggering an address sample after a row hammer repair (RHR) operation that is randomly-selected from activation row accesses within the memory system.

2. The method of claim 1, further comprising determining a number of refresh cycles needed for RHR operations.

3. The method of claim 1, further comprising allocating a predetermined fraction of refresh cycles to RHR operations.

4. The method of claim 1, wherein the stream of available data includes row activation addresses for a row within the memory system.

5. The method of claim 4, wherein a probability of selecting a particular row address from the stream of available is distributed approximately equally.

6. The method of claim 1, further comprising:
   after a toggle of the oscillator, sampling a subsequent activation address after the RHR operation;
   overwriting the sampled subsequent activation address after a subsequent toggling of the oscillator;
   continuing to overwrite a prior sampled activation address based on a state change of the oscillator occurring a random number of times;
   discontinuing the overwrite operations; and
   latching a most recently sampled activation address to provide the starting point for a RHR.

7. The method of claim 6, further comprising:
   making a determination of each address of a row of memory on either side of the latched activation address; and
   based on the determination of each of the addresses of the rows of memory on either side of the most recently sampled activation address, performing a memory refresh operation to each of the rows of memory on either side of the most recently sampled activation address.

8. The method of claim 1, wherein the refresh operation is performed without determining a number of times any of rows of memory are accessed.

9. The method of claim 1, further comprising providing a seed address for a subsequent RHR operation.

10. The method of claim 1, further comprising increasing a likelihood of selecting the randomly-chosen seed row from a row activation address within the stream of available data within a predetermined time interval, thereby lowering the possibility of selecting a row activation address from other time intervals.

11. The method of claim 10, further comprising determining an average RHR tune interval based a time period of refresh cycles and a percentage of the refresh cycles that are to be dedicated to the RHR operations.

12. The method of claim 11, further comprising selecting a number of the predetermined time intervals such that the number of the predetermined time intervals is greater than the average RHR time interval.

13. A method of operating a memory device, the method comprising:
   obtaining an address of a random one of a plurality of rows in a memory device receiving an activation signal;
   determining at least one row selected from a row before the obtained address and a row after obtained row address;
   sending a refresh signal to the at least one row; and
   discontinuing sampling of the plurality of rows in the memory device receiving an activation signal at a random time as determined by a cross of a preselected time interval and a random activate count latched when the sampling began.

14. The method of claim 13, further comprising:
   selecting a first randomly-chosen seed row within a first predetermined time interval; and
   recording a value of the first randomly-chosen seed row.

15. The method of claim 14, further comprising:
   selecting a second randomly-chosen seed row within a second predetermined time interval;
   overwriting the value of the first randomly-chosen seed row; and
   recording a value of the second randomly-chosen seed row.

* * * * *